(12) United States Patent
Breslin

(10) Patent No.: US 9,467,151 B1
(45) Date of Patent: Oct. 11, 2016

(54) APPARATUS AND METHODS FOR USING TUNING INFORMATION TO ADAPTIVELY AND DYNAMICALLY MODIFY THE PARAMETERS OF AN RF SIGNAL CHAIN

(71) Applicant: ANALOG DEVICES GLOBAL, Hamilton (BM)

(72) Inventor: James Breslin, Cork (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/844,447

(22) Filed: Sep. 3, 2015

(51) Int. Cl.
| H03L 7/08 | (2006.01) |
| H03B 5/12 | (2006.01) |
| H03F 3/24 | (2006.01) |
| H03F 1/56 | (2006.01) |
| H03F 3/191 | (2006.01) |

(52) U.S. Cl.
CPC ........... *H03L 7/0805* (2013.01); *H03B 5/1231* (2013.01); *H03B 5/1293* (2013.01); *H03F 1/56* (2013.01); *H03F 3/191* (2013.01); *H03F 3/245* (2013.01); *H03F 2200/451* (2013.01)

(58) Field of Classification Search
CPC ..... H03L 7/0804; H03L 7/187; H03L 7/099; H03L 7/10; H03L 7/101; H03J 3/20; H03J 2200/10; H03J 2200/08; H03F 3/191; H03H 11/28; H03H 2210/012; H03H 2210/04; H04B 1/1036
USPC .............................................. 331/2; 330/305
See application file for complete search history.

(56) References Cited

U.S. PATENT DOCUMENTS

| 6,097,244 | A  | * | 8/2000  | Chen ..................... H03H 11/04 327/308 |
| 8,073,414 | B2 |   | 12/2011 | Dubash et al. |
| 8,130,047 | B2 | * | 3/2012  | Finocchiaro .......... H03L 7/0891 327/156 |
| 8,508,308 | B2 | * | 8/2013  | Dong ....................... H03L 7/08 327/147 |
| 8,687,756 | B2 |   | 4/2014  | Sindalovsky et al. |
| 8,766,712 | B2 |   | 7/2014  | Shanan |
| 8,918,070 | B2 |   | 12/2014 | Shanan |
| 8,963,648 | B2 |   | 2/2015  | Shanan |
| 8,970,310 | B2 |   | 3/2015  | Breslin et al. |
| 8,970,315 | B2 |   | 3/2015  | Shanan |
| 2014/0266481 | A1 |  | 9/2014  | Shanan |
| 2014/0329479 | A1 |  | 11/2014 | Shanan |

FOREIGN PATENT DOCUMENTS

GB  2493798 A  2/2013

* cited by examiner

*Primary Examiner* — Ryan Johnson
(74) *Attorney, Agent, or Firm* — Knobbe, Martens, Olson & Bear, LLP

(57) ABSTRACT

Provided herein are apparatus and methods for using tuning information to adaptively and dynamically modify the parameters of an RF signal chain. The tuning information from an oscillator core, having multiple oscillators, adaptively tunes parameters of system components within a signal chain. In this way the system components are tuned to operate within a band tailored to the signal and to the oscillator core. In addition, RF impedances can be matched and power added efficiency can be enhanced in an area efficient monolithic integrated circuit.

21 Claims, 7 Drawing Sheets

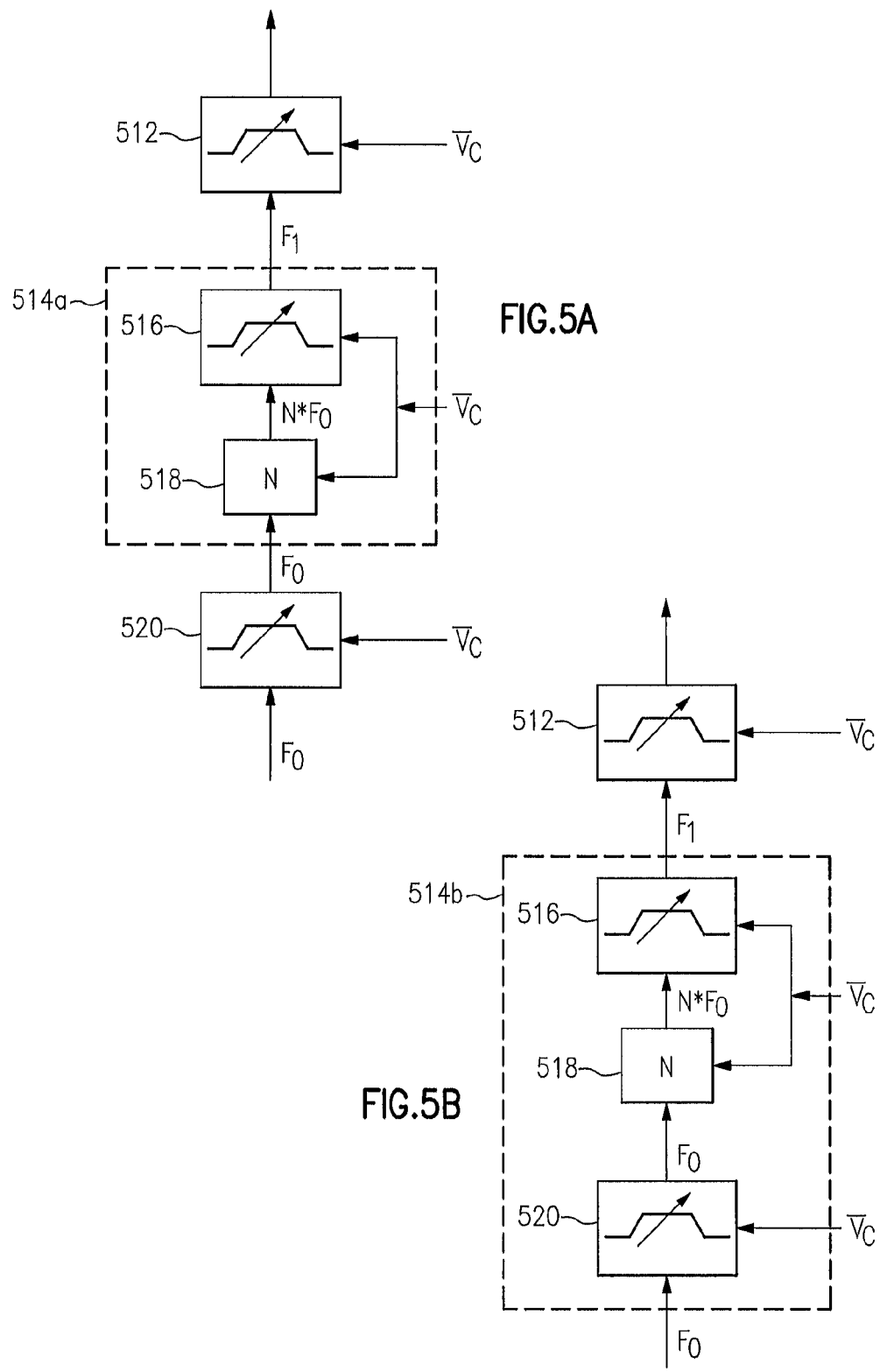

APPARATUS AND METHODS FOR USING TUNING INFORMATION TO ADAPTIVELY AND DYNAMICALLY MODIFY THE PARAMETERS OF AN RF SIGNAL CHAIN

BACKGROUND

1. Field

Embodiments of the invention relate to electronic circuits, and more particularly, to radio frequency systems with multi-core voltage controlled oscillators.

2. Description of the Related Technology

Radio frequency systems include voltage-controlled oscillators and can be used in electronic and communication applications. Radio frequency systems can be used in electronic and communication applications including clock generation and distribution. Voltage controlled oscillators can generate an oscillator output signal for a resonator or LC tank, and the frequency of oscillation can be determined by an LC tank with variable electrical characteristics.

In one application a radio frequency system uses a voltage controlled oscillator (VCO) as a local oscillator (LO) to mix and upconvert an input signal. By mixing the signal with the LO, an upconverted signal can be amplified and transmitted through a power amplifier (PA) within the RF signal chain.

SUMMARY

In one embodiment a radio frequency apparatus, having wide-tuning-frequency capabilities, comprises a multi-core voltage controlled oscillator and a radio frequency component. The multi-core voltage controlled oscillator is configured to provide output signals having a plurality of frequency bands. The multi-core voltage controlled oscillator includes a first voltage controlled oscillator and a second voltage controlled oscillator. The first voltage controlled oscillator has a first tuning unit configured to receive a plurality of control signals which tune a frequency range of the first voltage controlled oscillator. The second voltage controlled oscillator has a second tuning unit configured to receive a plurality of control signals which tune a frequency range of the second voltage controlled oscillator. The radio frequency component is configured to receive the plurality of control signals which tune a characteristic of the radio frequency component.

In addition, an output signal frequency of the first voltage controlled oscillator is tuned by a tuning voltage such that the output signal frequency of the first voltage controlled oscillator is a frequency of the frequency range of the first voltage controlled oscillator. Also, an output signal frequency of the second voltage controlled oscillator is tuned by a tuning voltage such that the output signal frequency of the second voltage controlled oscillator is a frequency of the frequency range of the second voltage controlled oscillator.

The radio frequency component can include a multiplexer configured to pass a select one of the output signal of the first voltage controlled oscillator and the output signal of the second voltage controlled oscillator based on the control signals. Also, a local oscillator filter can receive the select one of the output signal of the first voltage controlled oscillator and the output signal of the second voltage controlled oscillator. The radio frequency component can include the local oscillator filter where the characteristic is a frequency band of the local oscillator filter.

The radio frequency component can be a radio frequency power amplifier and the characteristic can be an input impedance of the radio frequency power amplifier. Also, the input impedance of the radio frequency power amplifier can be controlled by the plurality of control signals to be a matched impedance of the radio frequency apparatus. Additionally, the characteristic can be an output impedance of the radio frequency power amplifier; and the output impedance of the radio frequency power amplifier can be controlled by the plurality of control signals to be a matched impedance of the radio frequency apparatus. The radio frequency power amplifier can be configured as a narrow band amplifier.

The radio frequency component can be a band pass filter and the characteristic can be a frequency band of the band pass filter.

The radio frequency apparatus can be part of a monolithic integrated circuit.

In another embodiment a radio frequency apparatus, having wide-tuning-frequency capabilities, comprises a multi-core voltage controlled oscillator and a radio frequency component. The multi-core voltage controlled oscillator is configured to provide output signals having a plurality of frequency bands, and the multi-core voltage controlled oscillator includes a plurality of voltage controlled oscillators each having a tuning unit configured to receive a plurality of control signals and a tuning voltage. The control signals are configured to tune a frequency range of each of the plurality of voltage controlled oscillators, and the tuning voltage is configured tune an output signal frequency of each of the plurality of voltage controlled oscillators. Additionally, the radio frequency component is configured to receive the plurality of control signals, and the plurality of control signals tune a characteristic of the radio frequency component.

The radio frequency apparatus can include a multiplexer configured to pass a select one of the output signal of the plurality of voltage controlled oscillators based on the control signals. Also, a local oscillator filter can receive the select one of the output signal of the plurality of voltage controlled oscillators; and the radio frequency component can be the local oscillator filter where the characteristic is a frequency band of the local oscillator filter.

As described above, the radio frequency component is not limited to being the local oscillator filter. For instance, the radio frequency component can be a radio frequency power amplifier and the characteristic can be an input impedance of the radio frequency power amplifier.

In another embodiment a method of operating a radio frequency apparatus having wide-tuning-frequency capabilities comprises: calibrating a multi-core voltage controlled oscillator using a control vector of signals determined by a control loop; applying the control vector of signals to a multiplexer to pass a select output from a plurality of output signals having a plurality of frequency bands from the multi-core voltage controlled oscillator; applying the control vector of signals to at least one filter to adjust a filter characteristic of the at least one filter; and applying the control vector of signals to at least one amplifier to adjust a characteristic of the at least one amplifier. Also, the characteristic of the at least one amplifier includes an input impedance, an output impedance, and a power gain.

The method can also include applying the control vector of signals to a multiplexer to pass a select output from a plurality of output signals from the multi-core voltage controlled oscillator.

BRIEF DESCRIPTION OF THE DRAWINGS

These drawings and the associated description herein are provided to illustrate specific embodiments of the invention and are not intended to be limiting.

FIGS. 5A and 5B present a local oscillator signal chain receiving tuning information for frequency tracking in accordance with the teachings herein.

DETAILED DESCRIPTION OF EMBODIMENTS

Figure 1:
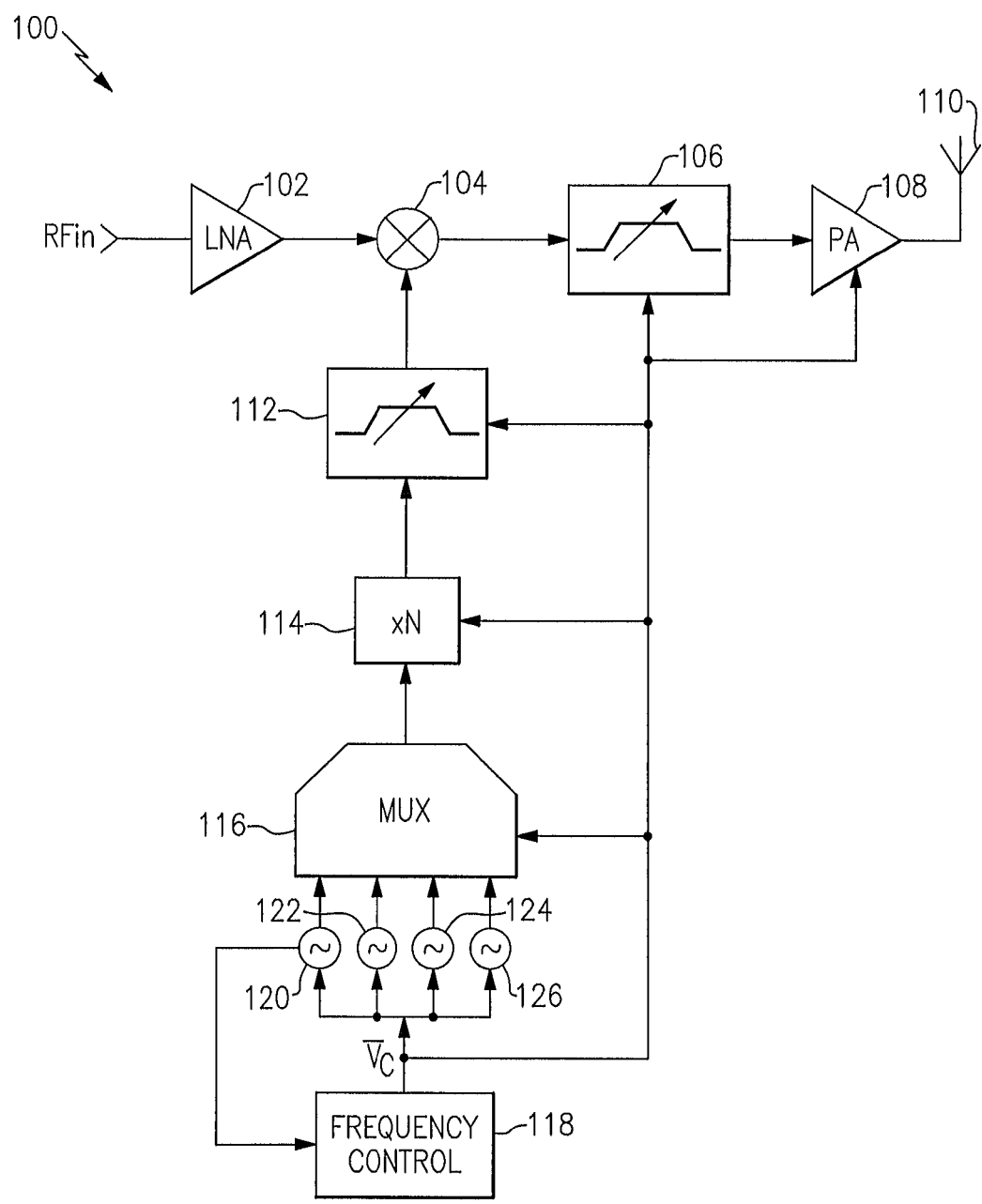
FIG. 1 is a top-level diagram of a radio frequency (RF) system using tuning information from a multi-core oscillator in accordance with the teachings herein.

The following detailed description of embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

System components of a radio frequency (RF) system can include voltage controlled oscillators (VCOs), local oscillator (LO) filters, band pass filters, power amplifiers (PAs), and low noise amplifiers (LNAs). A signal chain of an RF system refers to a signal path following connections of RF systems, and examples of RF signal paths include RF transmission paths and RF receiver paths.

The Federal Communication Commission (FCC) has set wireless standards in the form of frequency bands. For instance, the FCC has set the WCDMA standard for voice and data to regional frequency bands in the ranges of 880-915 MHz, 1.92-1.98 GHz, and 2.11-2.19 GHz. As another example, the FCC has set the Bluetooth standard for data applications in the band 2.4-2.4835 GHz.

In turn, RF signal paths can be designed to operate for a specific band by careful selection of components tailored to the frequency band of interest. For instance, a power amplifier can use matching networks to enhance the power added efficiency for a particular band of interest.

As the FCC opens more frequencies for civilian use, the concept of RF systems tailored to single frequency bands becomes obsolete; there is a need for RF systems which avail more than one band of operation. In particular, there is a need for RF systems availing multi-band operation.

In meeting this need an RF signal chain of an RF system requires a local oscillator (LO) with wideband capability. One approach can be to multiply a fundamental frequency of a VCO with a switchable bank of narrowband filters in order to realize and filter a local oscillator with suitable characteristics. However, having many narrowband filters in the form of a switchable bank is area inefficient and expensive.

Also, in meeting the need of multi-band operation, parasitic impedances can limit the band of operation for system components. For instance, matching is affected by parasitic impedances; and therefore it is desirable to have an apparatus which addresses matching characteristics as a function of frequency and bandwidth. Also, a power amplifier's power added efficiency can be affected by parasitic components including parasitic impedances. Therefore a new apparatus and methods to mitigate parasitic impedances without limiting bandwidth is desirable.

Provided herein are apparatus and methods for using tuning information to adaptively and dynamically modify the parameters of an RF signal chain. The tuning information for an oscillator core of a signal chain can be used to adapt system components, such as amplifiers and filters, to meet the specifications of a tuned band. In addition, the components can be part of an integrated circuit or monolithic integrated circuit manufactured using an RF appropriate process flow such as complementary metal oxide semiconductor micro-electromechanical systems (CMOS-MEMS) process.

FIG. 1 is a top-level diagram of a radio frequency (RF) system 100 using tuning information from a multi-core oscillator in accordance with the teachings herein. The multi-core oscillator consists of a first VCO 120, a second VCO 122, a third VCO 124, and a fourth VCO 126, each of which operates as a single core oscillator and is also referred to as a "single oscillator core" or "core". Each of the first through fourth VCOs 120-126 receives a control vector $\vec{V}_c$ of control signals from a frequency control block 118 and provides an output signal of a band-specific frequency. The oscillation frequency of each of the first-fourth VCOs 120-126, or cores, can be controlled by discrete switching elements. The switching elements allow a single oscillator core from the first-fourth VCOs 120-126 to be tuned over multiple frequency bands. The output signals cover more than one frequency band. Further, the overall multi-core oscillator, also referred to as a multi-core VCO, consists of multiple cores allowing the overall multi-core VCO to cover an octave frequency range. Therefore, the control vector $\vec{V}_c$ is a composite control signal which can contain both core and/or band control information.

Further details presenting how tuning signals of a control vector are operatively coupled to the multi-core oscillator can be similar to details presented in U.S. Pat. No. 8,970,310 B2 (also published as US20140097910), herein entirely incorporated by reference. Using a multi-core oscillator with a control vector $\vec{V}_c$ avails wide-tuning-frequency capabilities. The control vector $\vec{V}_c$ tunes the first through fourth VCOs 120-124 based upon local feedback from the first through fourth VCOs 120-124; and although FIG. 1 shows the multi-core oscillator as having just four VCOs, other configurations having fewer or greater VCOs are possible. In the RF system 100 the frequency control block 118 is shown to have a feedback connection from the first VCO 120; however, the frequency control block 118 can also receive feedback from each of the first through fourth VCOs to operationally control the frequency characteristics. Because the frequency control block 118 provides and adjusts the control vector $\vec{V}_c$ to match characteristics of the first through fourth VCOs 120-124, the control vector $\vec{V}_c$ is adjusted dynamically; the state of the control vector $\vec{V}_c$ is determined in real time through the feedback from the VCOs 120-124.

The output signals from the first through fourth VCO 120-124 are provided to a multiplexer 116. The multiplexer 116 then provides an output signal to a frequency multiplier 114 which provides a multiplied frequency output to a local oscillator filter 112. The local oscillator filter 112 then provides a filtered local oscillator signal to a mixer 104.

Also as shown in FIG. 1, an RF input signal RFin is provided at an input port of a low noise amplifier (LNA) 102, which in turn provides a first amplified output signal to the mixer 104. The mixer 104 mixes the first amplified output signal with the filtered local oscillator signal so as to produce a mixed signal. The mixed signal is filtered by a second filter 106 to provide an upconverted signal to the power amplifier (PA) 108. The PA 108 amplifies and then provides the upconverted signal to an antenna 110 for transmission.

According to the embodiments herein, the control vector $\vec{V}_c$ can advantageously tune RF system components outside of the multi-core oscillator. For instance, the control vector of signals can be used to control the multiplexer 116, the frequency multiplier 114, and the local oscillator filter 112 so as pass the filtered local oscillator signal to the mixer 104. By using the control vector $\vec{V}_c$ to tune the filter characteristics of the local oscillator filter 112, the local oscillator filter 112 can be designed with fewer components compared to a system which uses switchable narrowband banks of separate filters.

Also as shown in FIG. 1, the control vector $\vec{V}_c$ can further be used to tune filter characteristics of the second filter 106. The advantages can be similar to using the control vector $\vec{V}_c$ to control the filter characteristics of the local oscillator filter 112. In doing so, the second filter 106 can also be designed with fewer components compared to that of a system which uses switchable banks of filters.

The control vector $\vec{V}_c$ can also be used to tune characteristics of the frequency multiplier 114. For instance, the frequency multiplier 114 can include tracking filters which can also be tuned by the control vector $\vec{V}_c$ so as to dynamically vary a passband of a tracking filter according to frequency of a signal from the multi-core oscillator. In this way spurious signals generated by the frequency multiplier 114 can be advantageously filtered. Using the control vector $\vec{V}_c$ to dynamically adjust a passband of a tracking filter advantageously allows a wide tuning range without the need for multiple narrowband filters. As one of ordinary skill in the art of filter design can appreciate, filters can be designed to have different characteristics and to be of different types. For instance, the local oscillator filter 112 can be a bandpass filter, and the second filter 106 can also be a bandpass filter. Also, although the embodiment of FIG. 1 shows the signal paths as just having the local oscillator filter 112 and the second filter 106, fewer or greater filter blocks can be included within the signal chains.

Further as shown in FIG. 1, the control vector $\vec{V}_c$ can also be applied to amplifiers including the PA 108. The control vector $\vec{V}_c$ can adjust RF matching characteristics and power added efficiency (PAE) performance of the PA 108 by adjusting properties of an input and an output impedance network of the PA 108. Using the control $\vec{V}_c$ to tune the properties of the input and the output network of the PA 108 can advantageously eliminate the need to use narrow band reactive matching networks to accomplish the same. In doing so, the matching network can be designed with fewer components as compared to a system which uses narrow band reactive matching networks. PAE and frequency bandwidth (BW) performance can likewise be enhanced without the need of narrow band matching networks.

Figure 2A:
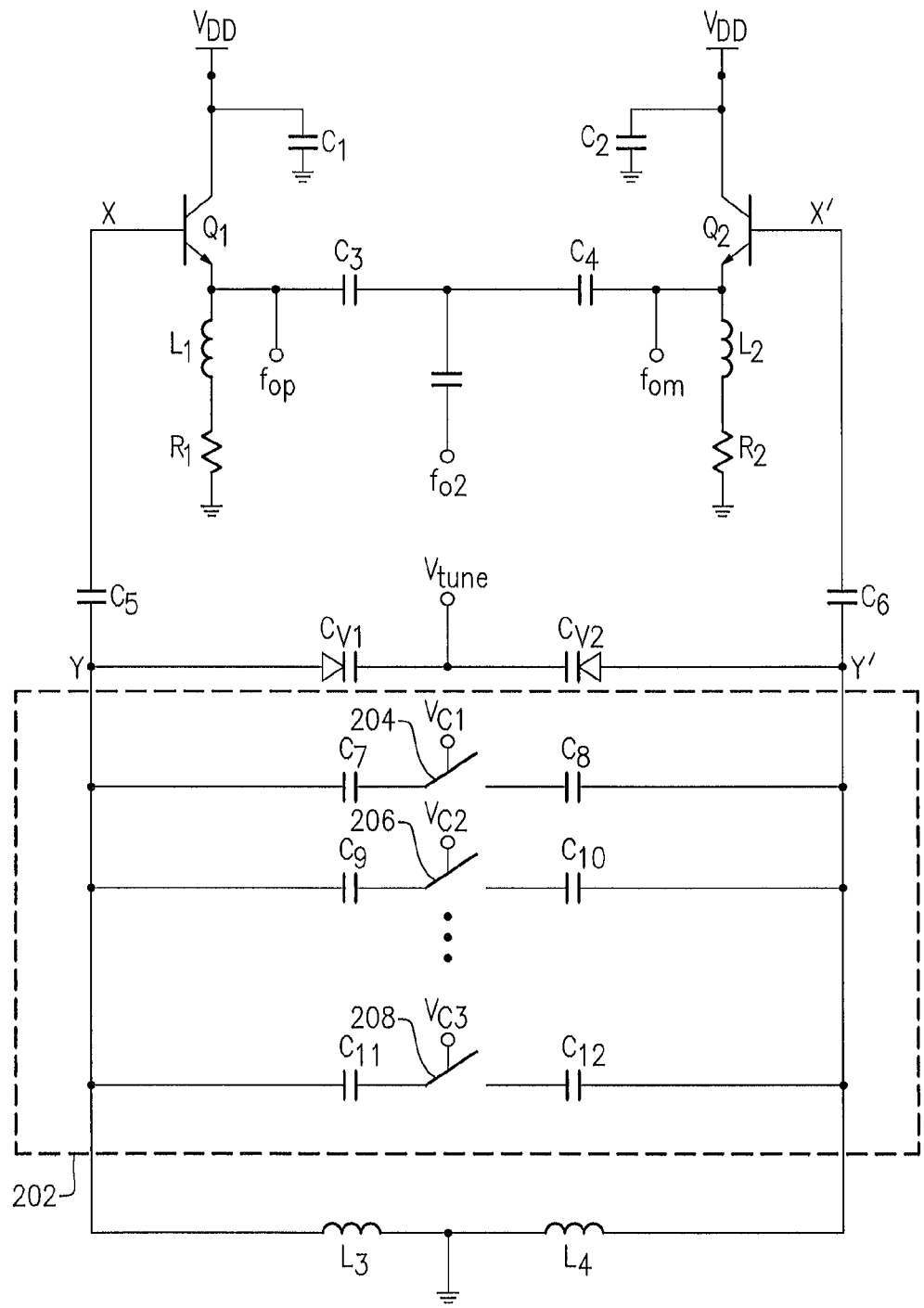
FIGS. 2A and 2B are circuit schematics of a voltage controlled oscillator (VCO) from an oscillator core according to one embodiment.
Figure 2B:
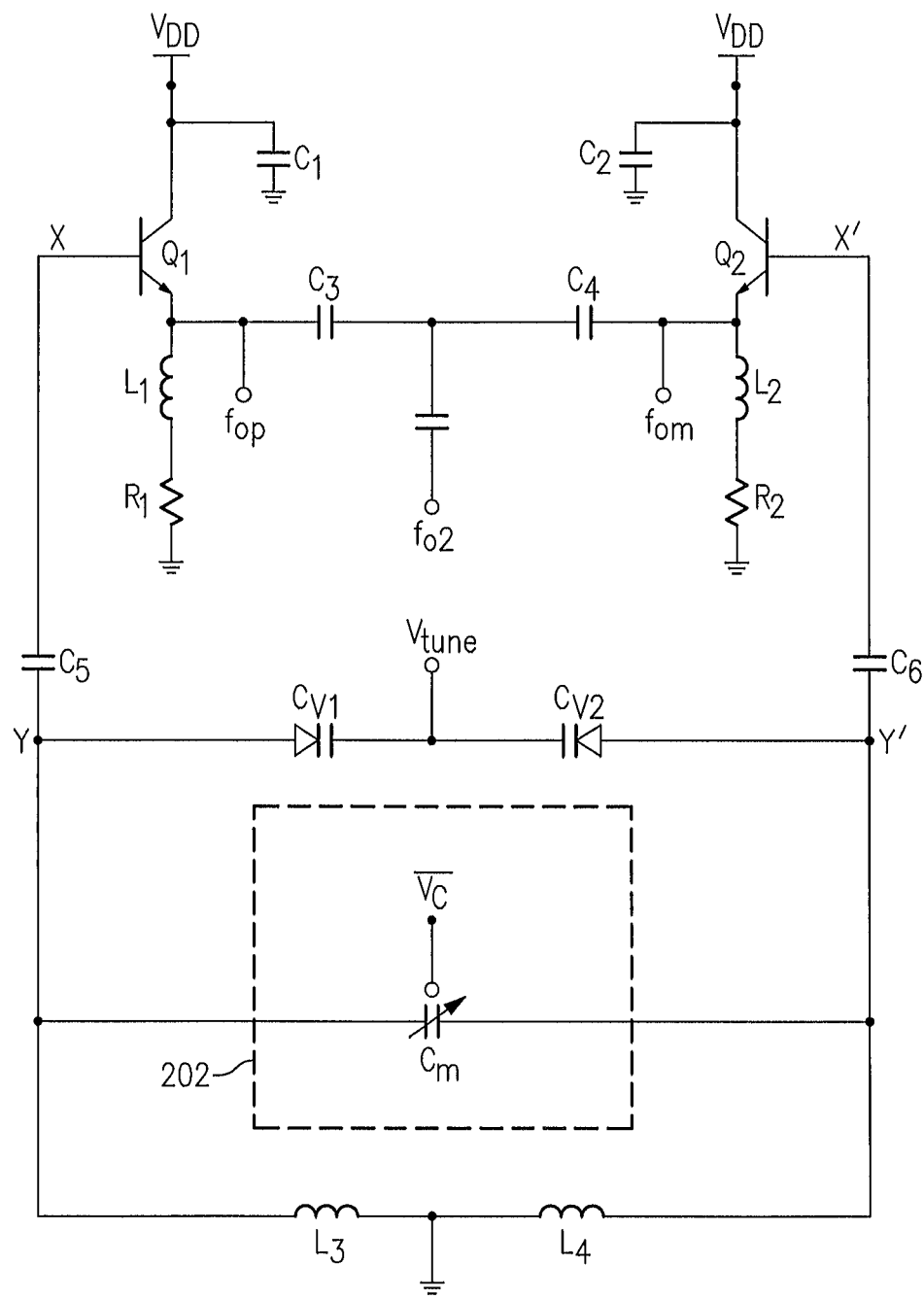

FIGS. 2A and 2B are circuit schematics of a voltage controlled oscillator (VCO) from an oscillator core according to one embodiment. For instance, the VCO of FIG. 2A and FIG. 2B can be used as one of the first through fourth VCOs 120-126 of the multi-core oscillator of FIG. 1. FIG. 2A is the circuit schematic of a push pull oscillator having a transistor Q1 and a transistor Q2 connected in a push pull common-collector configuration. The transistor Q1 has a collector connected to a supply node $V_{DD}$, an emitter connected to an output port fop, and a base connected to a node X. The transistor Q2 has a collector connected to the supply node $V_{DD}$, an emitter connected to an output port fom, and a base connected to a node X'.

A capacitor C1 is connected between the collector of the transistor Q1 and ground while a capacitor C2 is connected between the collector the transistor Q2 and ground. An inductor L1 and a resistor R1 are connected in series between the emitter of the transistor Q1 and ground while an inductor L2 and a resistor R2 are connected in series between the emitter of the transistor Q1 and ground. In addition, a capacitor C3 and C4 are connected in series between the output port fop and the output port fom. The capacitor C3 and C4 provide an additional common port fo2. Also, a first output signal is provided at the output port fop and a second output signal is provided at the output port fom. Additionally, a common output signal is provided at the common port fo2. The first, second, and common output signals have a VCO frequency tuned by a tunable LC tank network between the node X and the node X'.

The tunable LC tank network includes a capacitor C5 having a first capacitor node connected to the node X and a second capacitor node connected to a node Y and a capacitor C6 having a first capacitor node connected to the node X' and a second capacitor node connected to node Y'. An inductor L3 is connected between the node Y and ground while an inductor L4 is connected between the node Y' and ground. A first varactor $C_{V1}$ is connected between the node Y and a tuning port Vtune while a second varactor $C_{V2}$ is connected between the node Y' and Vtune.

The VCO frequency can be fine tuned by the application of a tuning voltage Vtune at the tuning port Vtune, and Vtune can be a separate signal independent of signals of the control vector $\vec{V}_c$.

FIG. 2A also shows a coarse tuning core 202 comprised of capacitors and switches connected between the node Y and the node Y'. In the coarse tuning core 202 switchable capacitive links are formed using capacitors and switches. A first switchable capacitive link comprises a capacitor C7 and a capacitor C8 connected between the node Y and the node Y' with a switch 204. The switch 204 receives a control signal $V_{C1}$ which can control the switch 204 to be open or closed as an electrical short. When the switch is closed the capacitors C7 and C8 are connected in series between the node Y and the node Y' to augment the total capacitance between the nodes Y and Y'. When the switch is open the capacitors C7 and C8 do not contribute to the capacitance between the nodes Y and Y'. A capacitor C9 and a capacitor C10 are similarly connected with a switch 206 between the nodes Y and Y'; and a capacitor C11 and a capacitor C12 are similarly connected with a switch 208 between the nodes Y and Y'. The switch 206 receives a control signal $V_{C2}$ which can control the switch 206 to be open or closed, and the switch 208 receives a control signal $V_{C3}$ which can control the switch 208 to be open or closed.

Further details of the apparatus and method of a coarse tuning core 202 are provided in U.S. Ser. No. 13/649,046 (Breslin, Ibid.); and one of ordinary skill in the art can appreciate how capacitors and switches can be connected to form a coarse tuning core 202 as shown in FIG. 2A.

The VCO frequency can be coarsely tuned to operate within a frequency band determined by the control signals $V_{C1}$-$V_{C3}$. The control signals $V_{C1}$-$V_{C3}$ can selectively open or close the switches 204-208 so as to vary the net capacitance between the node Y and the node Y'. In this way the tunable tank network can tune the VCO to operate within a frequency band determined by the control signals $V_{C1}$-$V_{C3}$.

Although the embodiment of FIG. 2A shows the coarse tuning core 202 as having three switchable capacitive links receiving three control voltages $V_{C1}$-$V_{C3}$, configurations having greater or fewer switchable capacitive links receiving greater or fewer control voltages are possible. Also, as one of ordinary skill in the art can appreciate, the switches 204-208 can be realized using FETs and the control signals can be voltages which control a gate of each of the FETs; further details are provided in U.S. Ser. No. 13/649,046 (Breslin, Ibid.).

FIG. 2B is a vector representation of the VCO of FIG. 2A. In particular, the coarse tuning core 202 has been simplified symbolically in a vector format. The switchable capacitive links with their corresponding switches 204-208 and their corresponding control signals have been compactly redrawn as a variable capacitance Cm receiving the control vector $\vec{V}_c$. The control vector $\vec{V}_c$ can comprise control signals $V_{C1}$-$V_{C3}$ and additionally may comprise a composite control signal consisting of both core and band control information. One of ordinary skill in the analysis of circuits using multiple signals in a vector format can appreciate this compact version.

Also, while the embodiment of FIGS. 2A and 2B shows an oscillator core using a push-pull oscillator using the transistors Q1 and Q2 in common-collector configuration, other oscillator configurations are possible. For instance, as one of ordinary skill in the art can appreciate, an oscillator can be designed using transistors connected in a common-base configuration. Or instead of a push-pull oscillator topology, an oscillator topology using cross-coupled transistor pairs can be used to realize a VCO.

The embodiments of FIGS. 2A and 2B can be fabricated according to GaAs BiFet and/or SiGe based BiCMOS silicon process technologies. The transistors Q1 and Q2 can have various structural types, including, but not limited to, BJT, JFET, MOSFET, IGFET, MESFET, pHEMT, HBT, and the like transistor structural types. The transistors Q1 and Q2 can also have various polarities, such as N-type, P-type, NPN-type, or PNP-type; and can include various semiconductor materials, such as GaAs, SiGe, and the like.

Figure 3A:
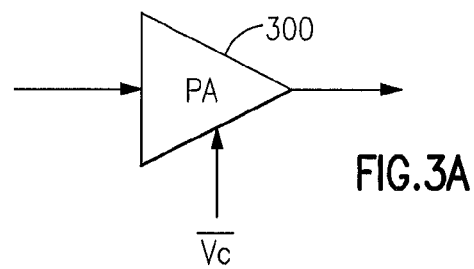
FIGS. 3A-3C present a vector description of a power amplifier (PA) receiving tuning information according to one embodiment.
Figure 3B:
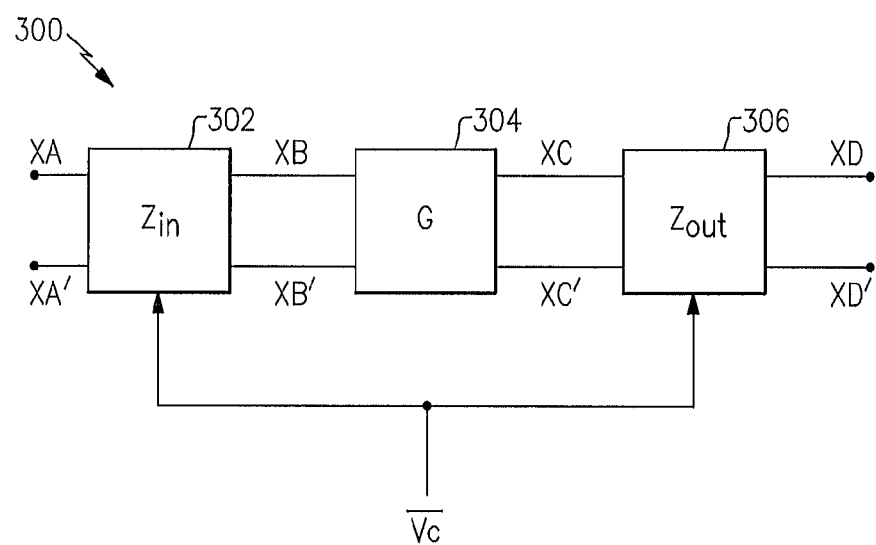
Figure 3C:
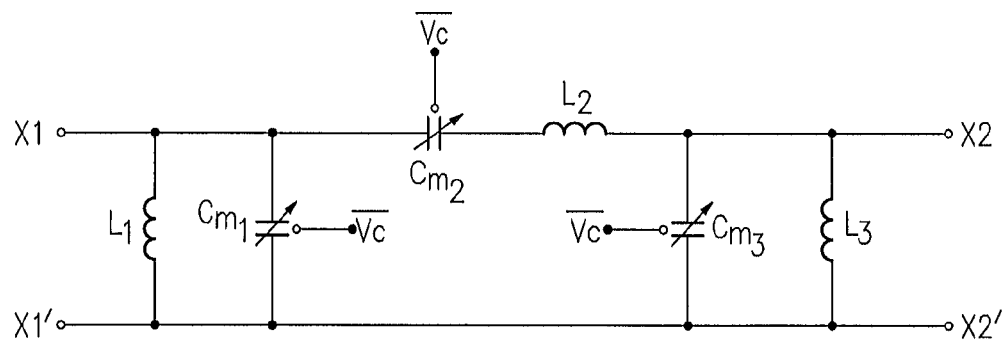

FIGS. 3A-3C present a vector description of a power amplifier (PA) 300 receiving tuning information according to one embodiment. The PA 300 can be part of an RF signal chain similar to the PA 108 of FIG. 1. The PA 300 of FIG. 3A is a system representation showing the PA 300 as receiving the control vector $\vec{V}_c$ which can have one or more control signals such as the control signals $V_{C1}$, $V_{C2}$, and $V_{C3}$ of FIGS. 2A and 2B.

FIG. 3B is system representation of the PA 300 of FIG. 3A and shows the PA 300 as an input impedance stage 302, a gain stage 304, and an output impedance stage 306. The input impedance stage 302, the gain stage 304, and the output impedance stage 306 are connected in cascade as two port systems or networks. The input impedance stage 302 has an input port between a node XA and a node XA' and an output port between a node XB and a node XB'. The gain stage 304 has an input port between the node XB and the node XB' and an output port between a node XC and a node XC'. Additionally, the output impedance stage 306 has an input port between the node XC and the node XC' and an output port between a node XD and a node XD'.

In the embodiment of FIG. 3B, the control vector $\vec{V}_c$ is received by the input impedance stage 302 and the output impedance stage 308. The control vector $\vec{V}_c$ can tune the input impedance stage 302 in order to match the input impedance stage 302 with respect to a band-specific signal. As discussed with respect to the RF system of FIG. 1, the control vector $\vec{V}_c$ contains the band information from the local feedback loop of the multi-core oscillator.

As shown in FIG. 3C, the control vector can control impedance networks. The embodiment of FIG. 3C shows a vector representation of a tunable network and can represent either or both of the input impedance stage 302 and the output impedance stage 308. The tunable network of FIG. 3C is a two-port network having an input port defined between a node X1 and a node X1' and an output port between a node X2 and a node X2'. Here an inductor L1 and a variable capacitance Cm1 are parallel connected between the nodes X1 and X1'. An inductor L2 and a variable capacitance Cm2 are series connected between the nodes X1 and X2; and an inductor L3 and a variable capacitance Cm3 are parallel connected between the nodes X2 and X2'. As shown in the tunable network of FIG. 3C, the node X2' is physically the same as the node X1'. However, as one of ordinary skill in the art can appreciate, in a two port network other elements, such as capacitors or inductors, can be interposed within the branch, or circuit path, between X1' and X2'.

With reference to FIG. 2B, the tunable network of FIG. 3C can be used as the input impedance stage 302 with the nodes X1 and X1' corresponding to the nodes XA and XA' and with the nodes X2 and X2' corresponding to the nodes XB and XB'. Additionally, the tunable network of FIG. 3C can be used as the output impedance stage 308 with the nodes X1 and X1' corresponding to the nodes XC and XC' and with the nodes X2 and X2' corresponding to the nodes XD and XD'.

The variable capacitances Cm1, Cm2, and Cm3 can be switchable capacitive links controlled by the vector $\vec{V}_c$ similar to the switchable capacitive link represented by the variable capacitance Cm of FIG. 2B. The variable capacitances Cm1, Cm2, and Cm3 can further be controlled by the control vector $\vec{V}_c$ to tune an impedance, also referred to as an RF impedance, of the input impedance stage 302 and an RF impedance of the output impedance stage 308. In doing so, the input impedance stage 302 and the output impedance stage 308 can be matched to the gain stage 306 for signals of an appropriate bandwidth determined by the multi-core oscillator. Matching the input impedance stage 302 and the output impedance stage 308 with the gain stage 306 can advantageously enhance performance and improve PAE. Also, because the variable capacitances Cm1, Cm2, and Cm3 can be part of a monolithic chip, the chip area can be reduced compared to a chip using banks of narrowband filters.

Although FIG. 3C shows an embodiment of the tunable network as having a passive component configuration with three inductors L1 through L3 and variable capacitances Cm1 through Cm3, other configurations having greater or fewer inductors and variable capacitances are possible. One of ordinary skill in the art can appreciate that a tunable network can have other configurations using variable capacitances tuned by the control vector $\vec{V}_c$.

Figure 4A:
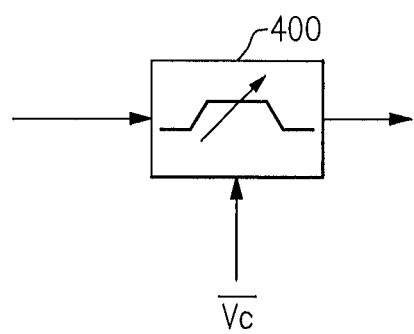
FIGS. 4A and 4B present a vector description of an RF filter receiving tuning information according to one embodiment.
Figure 4B:
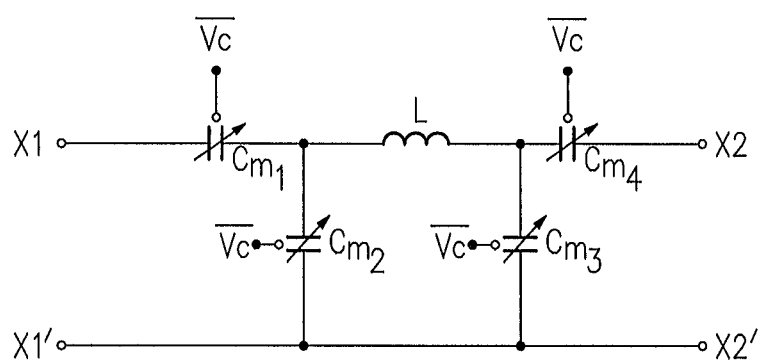

FIGS. 4A and 4B present a vector description of an RF filter 400 receiving tuning information according to one embodiment. The RF filter 400 of FIG. 4A can be part of an RF signal chain similar to the local oscillator filter 112 and to the second filter 106 of FIG. 1. Similar to the input impedance stage 302 and the output impedance stage 308 of FIGS. 3B and 3C, the RF filter 400 can be realized using inductors and variable capacitances.

FIG. 4B can be a realization of the RF filter 400 using a two port network with an input port between the node X1 and the node X1' and an output port between a node X2 and a node X2'. Here a variable capacitance Cm1 is connected between the node X1 and a first node of an inductor L while a variable capacitance Cm4 is connected between the node X2 and a second node of the inductor L. In addition a variable capacitance Cm2 is connected between the first node of the inductor L and the node X1' while a variable capacitance Cm3 is connected between the second node of the inductor L and the node X2'. Also as shown in the tunable network of FIG. 3C, the node X2' is physically the same as the node X1'. However, as one of ordinary skill in the art can appreciate, in a two port network other elements, such as capacitors or inductors, can be interposed within the branch between X1' and X2'.

Realizing the RF filter 400 using variable capacitances which receive the control vector $\nabla_c$ provides similar advantages as those described with regards to realizing the input impedance stage 302 and the output impedance stage 308 of FIGS. 2B and 2C. Filter characteristics such as bandwidth and center frequency can be set based upon the control vector $\nabla_c$. When used within a system such as the RF system of FIG. 1, the control vector $\nabla_c$ can advantageously tune filter characteristics of the RF filter 400 without requiring the use of area consuming tunable filter banks.

Although FIG. 4B shows an embodiment of the RF filter 400 as having a passive component configuration with an inductor L and variable capacitances Cm1 through Cm4, other configurations having greater or fewer inductors and variable capacitances are possible. One of ordinary skill in the art can appreciate that the RF filter 400 can have other configurations using variable capacitances tuned by the control vector $\nabla_c$.

FIGS. 5A and 5B present a local oscillator signal chain receiving tuning information for frequency tracking in accordance with the teachings herein. The embodiment of FIG. 5A shows a signal chain with a filter 520, a multiplier 514a, and a filter 512, each of which receives a control vector $\nabla_c$. The control vector $\nabla_c$ is a control vector from a multi-core oscillator and contains the tuning information for frequency tracking. The filter 520 receives a signal Fo, where Fo indicates a center frequency of the signal Fo and removes sideband frequency components determined by the control vector $\nabla_c$; the signal Fo can be a VCO output signal from a multi-core oscillator such as that provided at the output of the multiplexer 116 of FIG. 1. Within the multiplier 514a a block 518 multiplies the frequency of the signal Fo so as to provide a signal N*Fo (N times Fo), where N*Fo indicates a center frequency of N times the frequency Fo. Also shown in FIG. 5A, a filter 516 receives the signal N*Fo and provides additional filtering. Further, the control vector $\nabla_c$ controls the block 518 and the filter 516 so as to vary the filtering characteristics of the filter 516 with respect to the frequency Fo of the signal Fo. In this way the filter 516 dynamically tracks the frequency Fo, and can be referred to as a tracking filter. The multiplier 514a provides a signal $F_1$, where $F_1$ indicates a center frequency $F_1$.

The signal $F_1$ is received by the filter 512 which can further filter the signal $F_1$ with a passband controlled by the control vector $\nabla_c$. Additionally, the filter 512 can be the local oscillator filter 112 of FIG. 1 and provide a signal output for a mixer such as the mixer 114. Also, although the embodiment of FIG. 5A shows the local oscillator signal chain to have the filter 520, the multiplier 514a, and the filter 512, embodiments having fewer or greater components are possible. For instance, as one of ordinary skill in the art can appreciate, the local oscillator signal chain can have additional filter stages or filters of various characteristics such as high pass filters.

Also, using the control vector $\nabla_c$ to change the filtering characteristics of the filter 516 and the passband of the filters 520 and 516 can advantageously provide signal filtering without requiring the use of area consuming narrowband tunable filter banks.

FIGS. 5A and 5B present a local oscillator signal chain receiving tuning information for frequency tracking in accordance with the teachings herein. The embodiment of FIG. 5A is similar to the embodiment of FIG. 5B except the local oscillator signal chain of FIG. 5B uses a multiplier 514b with embedded filtering. Instead of using the filter 520 external to the multiplier 514a as shown in FIG. 5A, the filter 520 is embedded within the multiplier 514b. In this way the function of the filter 520 with the multiplier 514a of FIG. 5A can be similar or equivalent to the function of the multiplier 514b with embedded filtering as shown in FIG. 5B.

Figure 6:
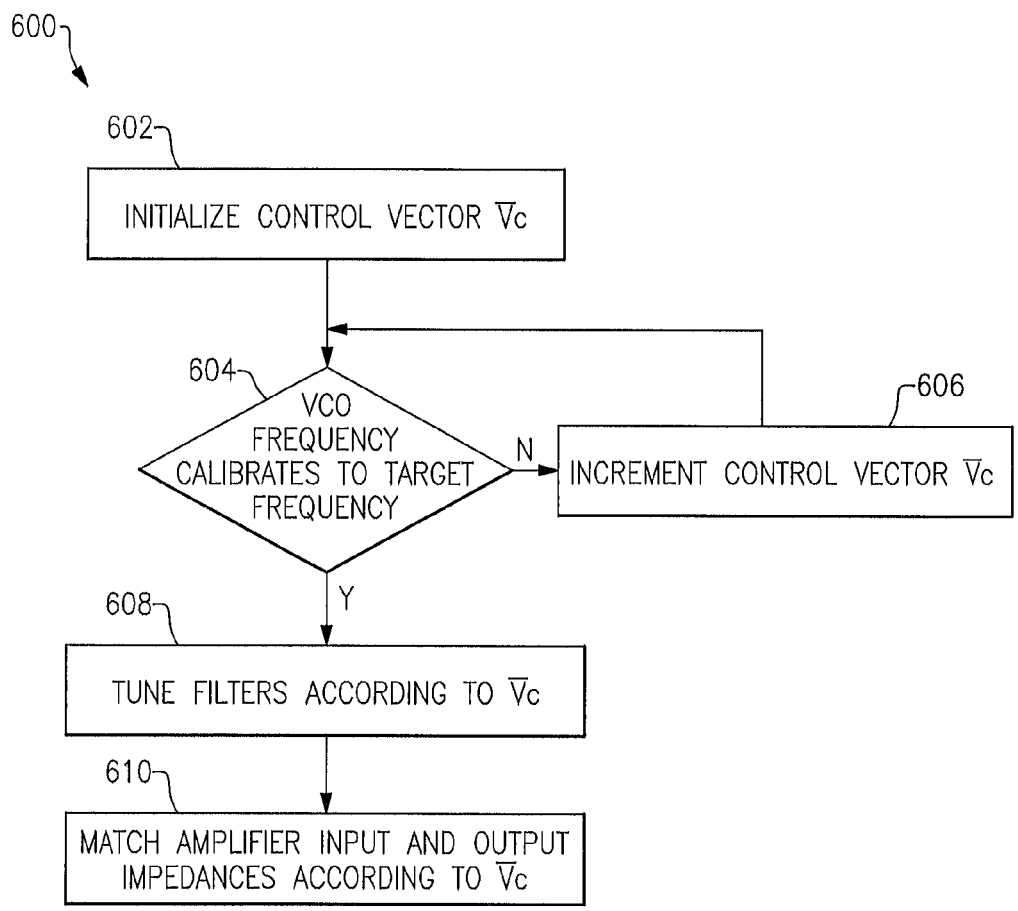
FIG. 6 is a flow diagram of an RF system using tuning information from an oscillator core in accordance with the teachings herein.

FIG. 6 is a flow diagram 600 of an RF system using tuning information from an oscillator core in accordance with the teachings herein. The flow diagram 600 provides an embodiment of a method for modifying parameters of an RF signal chain such as the signal chain of the RF system of FIG. 1. An operation step 602 can initialize a control vector $\nabla_c$ of control signals such as the control vector $\nabla_c$ of FIG. 2B; and the control vector $\nabla_c$ can comprise control signals such as $V_{C1}$ through $\nabla_{C3}$ of FIG. 2A. Initializing a control vector $\nabla_c$ can also correspond to applying power to the RF system of FIG. 1. Following initializing the control vector, a decision step 604 can represent a feedback loop of the multi-band oscillator with the frequency control block 118 of FIG. 1. The purpose of the feedback loop is to tune a plurality of VCOs such as VCOs 120-124 of FIG. 1 according to conditions as discussed with regards to FIG. 1 and as set forth in U.S. Ser. No. 13/649,046 (Breslin, Ibid.). Within the decision step 604 if the feedback conditions are met, then the VCOs have been coarsely tuned or calibrated to their desired bandwidths. If the conditions have not been satisfied, then the control vector $\nabla_c$ of control signals is adjusted or incremented and the decision step 604 retests the condition. Once the condition is satisfied indicating the VCOs are coarsely tuned, then in an operation step 608, the control vector $\nabla_c$ is provided to filters of the RF signal chain such as the local oscillator filter 112 and the second filter 106 of FIG. 1. Following operation step 608, an operation step 610 represents the application of the control vector to amplifiers or an amplifier of the system. The control vector can match input and output impedances of the amplifier and can thereby enhance amplifier PAE.

Although the flow diagram 600 of FIG. 6 shows just two operation steps 608 and 610 following the decision step 604, fewer or greater operation steps are possible. For instance, the control vector $V_c$ can control a multiplexer such as the multiplexer 116 of FIG. 1. In general, when a signal path comprises additional or fewer elements or RF components having a property or characteristic which is tunable, then the control vector $\nabla_c$ can also be provided to said additional or fewer elements. In doing so, the control vector $\nabla_c$ can tune the element or RF component without using area encumbering approaches requiring tunable or switchable banks of filters.

APPLICATIONS

Devices employing the above described radio frequency signal paths can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A radio frequency apparatus having wide-tuning-frequency capabilities, the apparatus comprising:
    a multi-core voltage controlled oscillator, wherein the multi-core voltage controlled oscillator is configured to provide output signals having a plurality of frequency bands, and wherein the multi-core voltage controlled oscillator includes:
        a first voltage controlled oscillator having a first tuning unit configured to receive a plurality of control signals, wherein the plurality of control signals tune a frequency range of the first voltage controlled oscillator; and
        a second voltage controlled oscillator having a second tuning unit configured to receive the plurality of control signals, wherein the plurality of control signals tune a frequency range of the second voltage controlled oscillator;
    a radio frequency component configured to receive the plurality of control signals, wherein the plurality of control signals tune a characteristic of the radio frequency component, and wherein the plurality of control signals selects a select output signal from the output signals having the plurality of frequency bands; and
    a frequency multiplier configured to multiply a frequency of the select output signal in response to the control signals.

2. The radio frequency apparatus of claim 1,
    wherein an output signal frequency of the first voltage controlled oscillator is tuned by a tuning voltage such that the output signal frequency of the first voltage controlled oscillator is a frequency of the frequency range of the first voltage controlled oscillator; and
    wherein an output signal frequency of the second voltage controlled oscillator is tuned by a tuning voltage such that the output signal frequency of the second voltage controlled oscillator is a frequency of the frequency range of the second voltage controlled oscillator.

3. The radio frequency apparatus of claim 2, further comprising a multiplexer;
    wherein the multiplexer is configured to pass a select one of the output signal of the first voltage controlled oscillator and the output signal of the second voltage controlled oscillator based on the control signals.

4. The radio frequency apparatus of claim 3,
    wherein a local oscillator filter receives the select one of the output signal of the first voltage controlled oscillator and the output signal of the second voltage controlled oscillator; and
    wherein the radio frequency component is the local oscillator filter and the characteristic is a frequency band of the local oscillator filter.

5. The radio frequency apparatus of claim 1,
    wherein the radio frequency component is a radio frequency power amplifier and the characteristic is an input impedance of the radio frequency power amplifier; and
    wherein the input impedance of the radio frequency power amplifier is controlled by the plurality of control signals to be a matched impedance of the radio frequency apparatus.

6. The radio frequency apparatus of claim 1,
    wherein the radio frequency component is a radio frequency power amplifier and the characteristic is an output impedance of the radio frequency power amplifier; and
    wherein the output impedance of the radio frequency power amplifier is controlled by the plurality of control signals to be a matched impedance of the radio frequency apparatus.

7. The radio frequency apparatus of claim 1, wherein the radio frequency component is a radio frequency power amplifier and the characteristic is a frequency band of the radio frequency power amplifier.

8. The radio frequency apparatus of claim 7, wherein the radio frequency power amplifier is configured as a narrow band amplifier.

9. The radio frequency apparatus of claim 1, wherein the radio frequency component is a band pass filter and the characteristic is a frequency band of the band pass filter.

10. The radio frequency apparatus of claim 1, wherein the radio frequency apparatus is part of a monolithic integrated circuit.

11. A radio frequency apparatus having wide-tuning-frequency capabilities, the apparatus comprising:
    a multi-core voltage controlled oscillator, wherein the multi-core voltage controlled oscillator is configured to provide output signals having a plurality of frequency bands, and wherein the multi-core voltage controlled oscillator includes a plurality of voltage controlled oscillators each having a tuning unit configured to receive a plurality of control signals and a tuning voltage, wherein the control signals are configured to tune a frequency range of each of the plurality of voltage controlled oscillators, and wherein the tuning voltage is configured tune an output signal frequency of each of the plurality of voltage controlled oscillators;
    a radio frequency component configured to receive the plurality of control signals, wherein the plurality of control signals tune a characteristic of the radio frequency component and selects a select output signal from the output signals having the plurality of frequency bands; and a frequency multiplier configured to multiply a frequency of the select output signal in response to the control signals.

12. The radio frequency apparatus of claim 11, further comprising a multiplexer;
wherein the multiplexer is configured to pass a select one of the output signals of the plurality of voltage controlled oscillators based on the control signals.

13. The radio frequency apparatus of claim 12,
wherein the frequency multiplier comprises a tracking filter;
wherein the tracking filter receives the select one of the output signals of the plurality of voltage controlled oscillators; and
wherein the radio frequency component is the tracking filter and the characteristic is a frequency band of the tracking filter.

14. The radio frequency apparatus of claim 11,
wherein the radio frequency component is a radio frequency power amplifier and the characteristic is an input impedance of the radio frequency power amplifier; and
wherein the input impedance of the radio frequency power amplifier is controlled by the plurality of control signals to be a matched impedance of the radio frequency apparatus.

15. The radio frequency apparatus of claim 11,
wherein the radio frequency component is a radio frequency power amplifier and the characteristic is an output impedance of the radio frequency power amplifier; and
wherein the output impedance of the radio frequency power amplifier is controlled by the plurality of control signals to be a matched impedance of the radio frequency apparatus.

16. The radio frequency apparatus of claim 11, wherein the radio frequency component is a radio frequency power amplifier and the characteristic is a frequency band of the radio frequency power amplifier.

17. The radio frequency apparatus of claim 16, wherein the radio frequency power amplifier is configured as a narrow band amplifier.

18. The radio frequency apparatus of claim 11, wherein the radio frequency component is a band pass filter and the characteristic is a frequency band of the band pass filter.

19. The radio frequency apparatus of claim 11, wherein the radio frequency apparatus is part of a monolithic integrated circuit.

20. A method of operating a radio frequency apparatus having wide-tuning-frequency capabilities comprising:
calibrating a multi-core voltage controlled oscillator using a control vector of signals determined by a control loop;
applying the control vector of signals to a multiplexer to pass a select output from a plurality of output signals having a plurality of frequency bands from the multi-core voltage controlled oscillator;
applying the control vector of signals to at least one filter to adjust a filter characteristic of the at least one filter; and
applying the control vector of signals to at least one amplifier to adjust a characteristic of the at least one amplifier, wherein the characteristic of the at least one amplifier includes an input impedance, an output impedance, and a power gain.

21. The method of claim 20 further comprising:
applying the control vector of signals to the multiplexer to pass the select output from the plurality of output signals from the multi-core voltage controlled oscillator.

* * * * *